(12) United States Patent
Rainish et al.

(10) Patent No.: US 6,298,102 B1
(45) Date of Patent: Oct. 2, 2001

(54) MAXIMUM LIKELIHOOD SEQUENCE ESTIMATION IN THE PRESENCE OF CO-CHANNEL INTERFERENCE

(75) Inventors: Doron Rainish, Ramat Gan; David Burshtein, Hertzelia, both of (IL)

(73) Assignee: DSPC Israel Ltd. (IL)

( * ) Notice: Subject to any disclaimer, the term of this patent is extended or adjusted under 35 U.S.C. 154(b) by 0 days.

(21) Appl. No.: 09/536,534

(22) Filed: Mar. 28, 2000

Related U.S. Application Data

(63) Continuation of application No. PCT/IL98/00461, filed on Sep. 24, 1998.

(30) Foreign Application Priority Data

Sep. 28, 1997 (IL) .......................................... 121843

(51) Int. Cl.⁷ .................................................. H04L 27/06
(52) U.S. Cl. ............................................ 375/341; 714/794
(58) Field of Search .................................... 375/341, 262, 375/346, 340; 714/794

(56) References Cited

U.S. PATENT DOCUMENTS

| | | | | |
|---|---|---|---|---|
| 5,251,233 | * | 10/1993 | Labedz et al. | 375/229 |
| 5,263,026 | * | 11/1993 | Parr et al. | 370/95.1 |
| 5,818,876 | * | 10/1998 | Love | 375/341 |

FOREIGN PATENT DOCUMENTS

| | | |
|---|---|---|
| 0667683 | 4/1995 | (EP) . |
| 9611533 | 4/1996 | (WO) . |
| 9726718 | 7/1997 | (WO) . |

OTHER PUBLICATIONS

"Maximum likelihood sequence estimation of digital sequences in the presence of intersymbol interference" IEEE vol. IT 18 No. 3, May 1972.*
Raheli et al. "Per Survivor Processing" Digital Signal Processing 3, pp. 175–187 (1993).

\* cited by examiner

*Primary Examiner*—Temesghen Ghebretinsae
(74) *Attorney, Agent, or Firm*—Baker Botts L.L.P.

(57) ABSTRACT

A method for conducting an improved approximated maximum likelihood decoding on a received signal on a receiving side, in the presence of a co-channel interference. The method include a determination regarding the maximum likely sequence which uses the improved decision metric in the following format $$\sum_n (|y_n - d_n| - \beta C)^2,$$

wherein $y_n$ is the received signal, $d_n$ is the hypothesized received signal excluding an additive channel interference, $\beta$ is an empirical coefficient, wherein $\beta > 1$, preferably $0 \leq 1$, and C is the envelope of a signal of the co-channel interference.

12 Claims, 3 Drawing Sheets

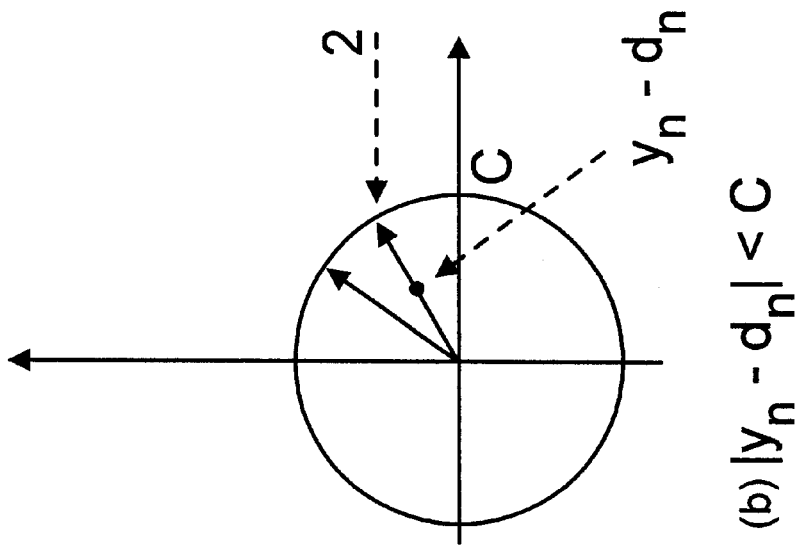
FIG. 1a  (a) $|y_n - d_n| > C$
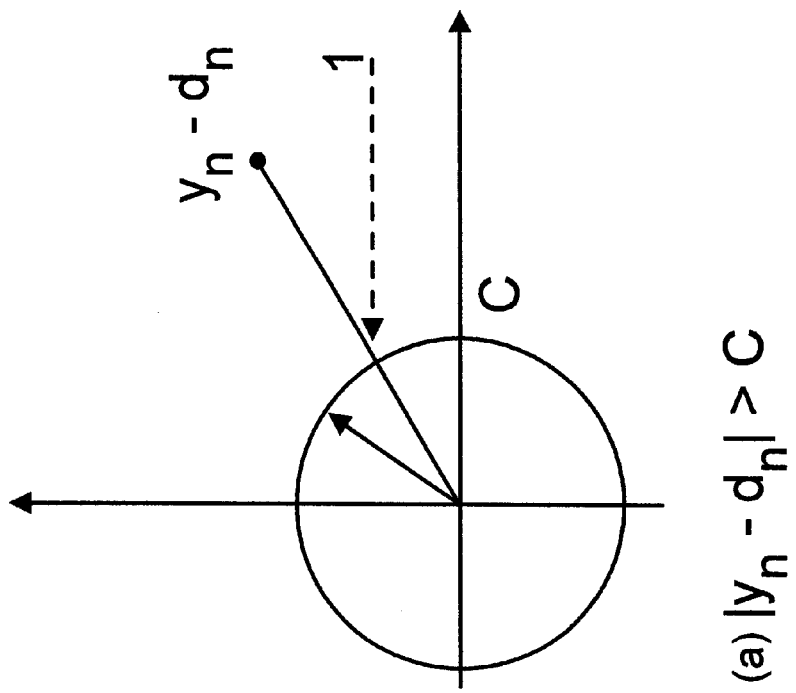
FIG. 1b  (b) $|y_n - d_n| < C$ continues.

MAXIMUM LIKELIHOOD SEQUENCE ESTIMATION IN THE PRESENCE OF CO-CHANNEL INTERFERENCE

This is a continuation of copending International application No. PCT/IL98/00461 filed Sep. 24, 1998.

FIELD OF THE INVENTION

The invention relates to a method for performing an improved approximated maximum likelihood decoding in digital communications applications and to a maximum likelihood receiver embodying means for carrying out said method. More particularly, the invention relates to such a method and receiver, when a significant source of channel interference is the co-channel interference.

BACKGROUND OF THE INVENTION

Interference is an unavoidable occurrence in communication systems. Therefore, communications systems designed for today's needs are provided with means for dealing with interference. Interference can be of different types. Prior art methods provide means for dealing with this problem, which are implemented in existing equipment.

One detection method used in the art utilizes a Maximum Likelihood Receiver.

As is known, under the white Gaussian noise assumption, the standard decision metric is given by $$\sum_n |y_n - d_n|^2 \quad (1)$$

wherein $d_n$ is the hypothized received signal excluding the additive channel interference, and $y_n$ denotes the received signal, i.e. $y_n = d_n + e_n$, where $e_n$ is the additive channel interference. The maximum likelihood receiver seeks for the input sequence that brings (1) to a maximum.

The metric of equation (1) is optimal in a maximum likelihood sense for additive white Gaussian noise, but is not optimal in the presence of significant co-channel interference (CCI).

CCI occurs when two or more signals overlap in frequency and are present concurrently. CCI is a severe hindrance to frequency and time-division multiple-access communications and is typically minimized by interference rejection/suppression techniques. One case in which this disturbance is severe is that of cellular radio networks where one or more secondary signals from nearby cells can interfere with the desired primary signal.

WO 96/11533 discloses a method for signal detection, in which a primary signal and at least one interfering co-channel signal are received on the same channel. The received signals have different, but known training sequences, and different transmission channels on the radio path. The transmission channel estimates of the primary signal and the interfering co-channel signal are determined by their training sequences. The primary signal is detected by utilizing the transmission channel estimates of both primary signal and the interfering co-channel signal.

EP 667683 discloses a communication system in which known data sequences characterise both wanted signals and interfering co-channel signals. The system comprises a receiver with sequence identifier means which includes a store for known data sequences and a correlator for correlating received signals with the stored known data sequences, so as to identify the relative location in time of received signal sequences; impulse response estimation meansfor estimating the impulse response of the received signal for which the location has been identified; means for producing a set of possible signal configurations in response to the estimated impulse responses; and detector means to filter the wanted signal by comparing the signals of each set with the received signal.

Although the art has dealt with this problem in various ways, no method has been provided which is on the one hand efficient when CCI is the dominant interference source, and on the other hand is robust and does not require a complicated receiver.

It is therefore an object of this invention to provide an approximated maximum likelihood decoding method which improves over the prior art methods and produces a better approximation when CCI is a significant or is the dominant interference source.

It is another purpose of this invention to provide a metric which permits to carry out said method.

It is a further purpose of this invention to provide a metric for carrying out said method.

It is a still further purpose of this invention to provide a Maximum Likelihod Receiver, which is more efficient than the prior art ones when CCI is a significant or the dominant interference source.

It is a still further purpose of this invention to provide such a receiver which is not complicated, and is robust.

Other purposes and advantages of this invention will appear as the description proceeds.

SUMMARY OF THE INVENTION

The invention comprises a method for conducting an approximated maximum likelihood decoding on a received, digitally modulated signal at the receiving side, in the presence of co-channel interference, using an improved decision metric.

Let the additive channel interference be denoted by $e_n = \epsilon_n + c_n$, wherein $\epsilon_n$ is the white noise interference component and $c_n$ is the CCI component, whose envelope is denoted by C. The method is especially suited for the case where the CCI signal is constant envelope, but may be used in other scenarios as well, in which case, C denotes the average envelope of the signal. The decision method of the invention is based on an improved decision metric which is given by:

$$\sum_n (|y_n - d_n| - \beta C)^2$$

wherein:

$y_n$ is the received signal;

$d_n$ is the hypothesized received signal excluding the additive channel interference;

$\beta$ is an empirical coefficient, wherein $0<\beta$, preferably $0<\beta \leq 1$.

C is the envelope of the CCI signal.

Practically, the amplitude of the CCI signal (C) is usually unknown. Therefore, it needs to be estimated. For that purpose, one may use the average of $|y_n - d_n|^2$, for determining $C^2$. For example, in a decision directed detection mode, this average is formed by utilizing the knowledge of the values of previous data symbols, $d_1, d_2, \ldots d_{n-1}$ at time index n, e.g., $\hat{C}_n^2 = \alpha \hat{C}_{n-1}^2 + (1-\alpha)|y_{n-1} - d_{n-1}|^1$, where $20 < \alpha < 1$ is some constant, e.g., $\alpha = 0.95$, and $\hat{C}$ is the estimated CCI envelope. In Viterbi based detection scheme, an estimation for $C^2$ may be obtained on a per survivor basis, in the same manner as channel estimates are obtained, e.g. in Raheli R. et. al, "Per Survivor Processing", Digital Signal Processing 3, pg. 175×187 (1993).

When $\beta=0$, viz. the CCI is not significant, the metric is reduced to the standard one. Therefore, in the method according to the invention $\beta>0$. On the other hand, $\beta=1$ is optimal if the CCI term is dominant compared to the additive noise interference. Typically, the value of $\beta$ is about 0.8.

The invention also comprises an approximate Maximum Likelihood Receiver which carries out said method and comprises means for calculating the improved decision metric $$\sum_n (|y_n - d_n| - \beta C)^2.$$

BRIEF DESCRIPTION OF THE DRAWINGS

FIG. 1a is a diagram describing the decision metric according to the invention wherein $|y_n-d_n|>C$;

FIG. 1b is a diagram describing the decision metric according to the invention wherein $|y_n-d_n|<C$;

DETAILED DESCRIPTION OF PREFERRED EMBODIMENTS

Let $d_n$ be the hypothesized signal after transmission through the channel (all signals are assumed complex), i.e. $d_n=a_n*p_n$, where $p_n$ is the hypothesized transmitted signal, $a_n$ is the Channel Impulse Response (CIR), and * denotes the convolution operator. $y_n$ denotes the received signal, i.e. $y_n=d_n+e_n$, where $e_n$ is the additive channel interference, that consists of two components, i.e., $e_n=\epsilon_n+c_n$, where $\epsilon_n$ is a white noise sample, and $c_n$ is a CCI sample.

The standard decision metric for the hypothesis p, given by $$m(p) = \sum_n |y_n - d_n|^2,$$

is optimal in a Maximum Likelihood sense for additive white Gaussian noise (i.e. no CCI), but is not expected to be optimal under the presence of CCI.

In fact, under the white Gaussian noise assumption, the log-likelihood of the observations is given by:

$$\log f(y_0, y_2, \ldots, y_{N-1}) = \sum_{n=0}^{N-1} \log f(y_n) = \frac{-1}{\sigma^2} \sum_{n=0}^{N-1} |y_n - d_n|^2 - N \log(2\pi\sigma^2)$$

and leads to the expression for the standard decision metric, m(p). Under the presence of CCI, m(p) is no longer optimal.

The invention suggests a new metric, which improves the standard m(p) metric when CCI is the dominant interference source. The CCI term $c_n$ is modeled by $c_n=Ce^{j\Theta_n}$, where the phase $\theta_n$ is uniformly distributed over $[-\pi\pi]$ and where the constant envelope C is assumed to be known. In practice, C needs to be estimated. In fact, utilizing a more accurate knowledge about the phase could be helpful, however, the resulting receiver would be much more complicated and much less robust than the one according to the invention. $f(y_n)$ is now given by, $$f(y_n) = E_{\theta_n}(f(y_n | \theta_n)) = \frac{1}{2\pi\sigma^2} \int_0^{2\pi} \exp\left(-\frac{|y_n - d_n - c_n|^2}{2\sigma^2}\right) \frac{d\theta_n}{2\pi}$$

where $c_n = Ce^{j\Theta_n}$.

This integral can also be written as an integral on a circle of radius C in the complex plane. It is shown in FIG. 1a for the case $|y_n-d_n|>C$, and in FIG. 1b for the case $|y_n-d_n|<C$.

Under the assumption that the CCI is dominant $-C<<\sigma-$ the most significant contribution to the integral is at the neighborhood of the maximum of the integrand. Arrows 1 and 2 indicate where this maximum is obtained in the cases of FIGS. 1a and 1b respectively. From FIGS. 1a and 1b, this maximum is easily seen to be $$\exp\left(-\frac{(|y_n - d_n| - C)^2}{2\sigma^2}\right),$$

which yields the approximation, $$f(y_n) \cong K \exp\left(-\frac{(|y_n - d_n| - C)^2}{2\sigma^2}\right)$$

where K is a multiplying constant. The method of the invention is therefore based on the improved metric:

$$\sum_n (|y_n - d_n| - C)^2.$$

This use of said metric was shown to enhance performance, especially for slowly fading channels (under the presence of CCI). Based on the above derivation we are motivated to use the following metric $$\sum_n (|y_n - d_n| - \beta C)^2,$$

where $0<\beta$, preferably $0<\beta\leq 1$.

Figure 2:
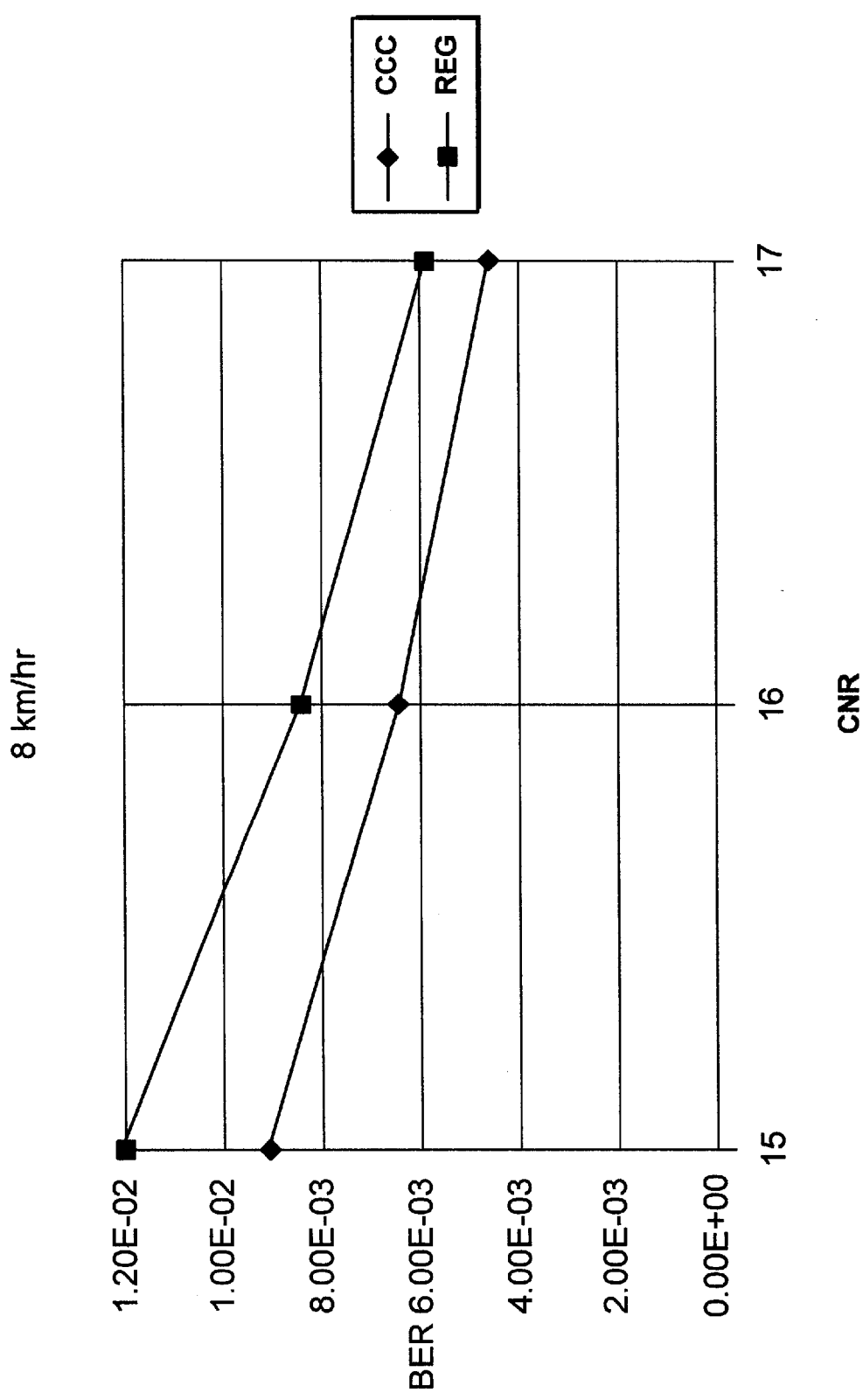
FIG. 2 is a diagram summarizing test results and comparing between the standard decision metric and the improved decision metric according to the invention.

The method of the invention was tested on a continuous phase frequency-shift keying (CPFSK) signal. More precisely, the modulation scheme was Gaussian Filtered Minimum Shift Keying (GMSK) with time-bandwidth product of ½, at a bit rate of 19.2 Kbits per second. The RF signal is constant envelope and the phase varies continuously (continuous phase modulation, CPM). The transmitted signal was subjected to a channel with fading and multi-path, and was then corrupted both by additive white Gaussian noise, and by CCI. The multipath duration was 16 µsec, and the velocity was 8 km/hr. The signal level at the receiver was −85 dBm, and the noise figure of the receiver was assumed to be 7 dB. The signal to noise ratio (SNR) was 39 dB. The signal to co-channel ratio varied between 15 and 17 dB. The receiver used was IQ based (i.e., the input to the receiver was comprised of samples of the received signal), receiver. The receiver was a maximum likelihood sequence estimator, implemented by Viterbi decoding, that includes channel estimation on a per survivor basis, as in Raheli R., "Per Survivor Processing", Digital Signal Processing 3, pg. 175–187 (1993). In FIG. 2, the bit error rate (BER) results are shown, both for the case where the standard metric was used (REG) and for the case where the new metric (CCC) with β=0.8 was used. CNR denotes the energy ratio between the desired and the interfering signal in db. Comparison of the results obtained in both cases shows that a significant improvement of about 0.75dB was obtained using the improved metric of the invention.

Figure 3:
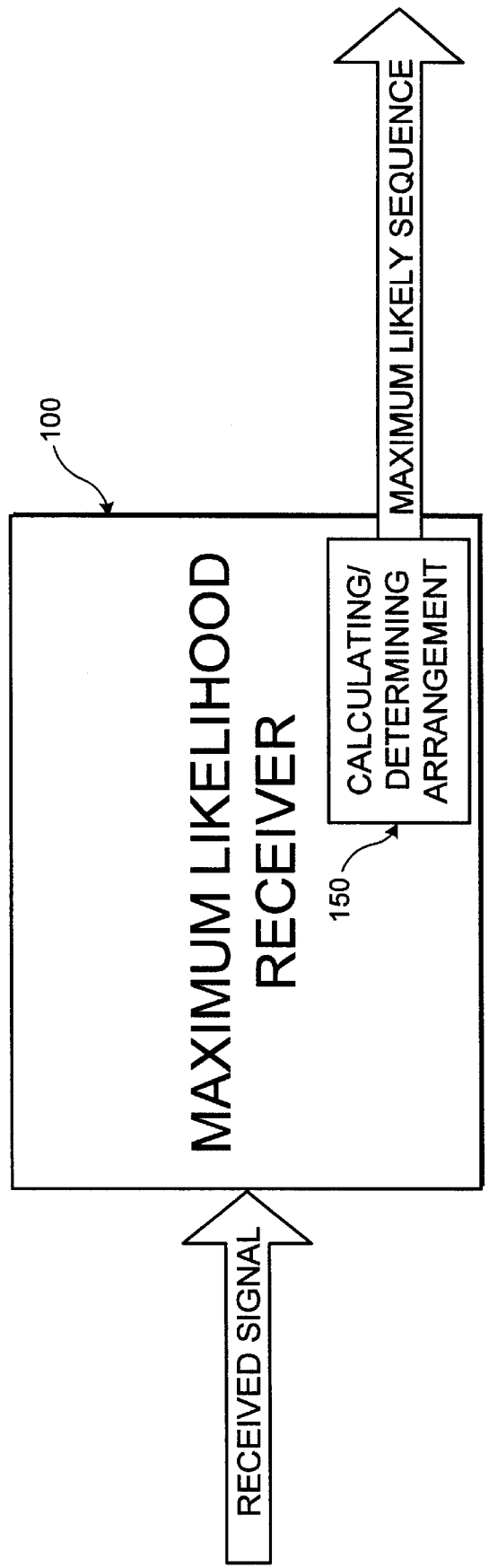
FIG. 3 is a block diagram of a Maximum Likelihood Receiver according to the invention.

FIG. 3 shows an block diagram of an exemplary Maximum Likelihood Receiver 100 according to the invention. This Maximum Likelihood Receiver 100 includes a calculating/determining arrangement 150 which receives a signal and calculates/determines a maximum likely sequence using the following equation $$\sum_n (|y_n - d_n| - \beta C)^2$$

in which $y_n$ is defined as the received signal, $d_n$ is the hypothesized received signal excluding an additive channel interference, β is an empirical coefficient, wherein β>0, preferably 0<β≦1, and C is the envelope of signal having a co-channel interference. Furthermore, the arrangement 150 can perform all aspects of the method according to the present invention described herein above.

What is claimed is:

1. A method for decoding a signal in the presence of a co-channel interference, comprising:

receiving the signal; and determining a maximum likely sequence using the following decision metric:

$$\sum_n (|y_n - d_n| - \beta C)^2$$

wherein:

$y_n$ is the received signal;

$d_n$ is the hypothesized received signal excluding an additive channel interference;

β is an empirical coefficient, wherein β>0; and

C is the envelope of a signal having the co-channel interference.

2. A method according to claim 1, further comprising estimating the value of the envelope C of the signal having the co-channel interference.

3. A method according to claim 1, wherein β is approximately 0.8.

4. A method according to claim 1, wherein $C^2$ is estimated to be proportional to the average of the equation $|y_n - d_n|^2$.

5. A method according to claim 4, wherein $C^2$ is estimated using the knowledge of the values of previous data symbols, $d_1, d_2, \ldots, d_{n-1}$ at a time index n.

6. A method according to claim 4, wherein $C^2$ is estimated in a Viterbi based detection scheme on a per-survivor basis.

7. A method according to claim 1, wherein β has a value which is 0<β≦1.

8. A Maximum Likelihood Receiver, comprising:

an arrangement receiving a signal and calculating a maximum likely sequence using the following decision metric:

$$\sum_n (|y_n - d_n| - \beta C)^2$$

wherein:

$y_n$ is the received signal;

$d_n$ is the hypothesized received signal excluding an additive channel interference;

β is an empirical coefficient, wherein β>0; and

C is the envelope of a signal having a co-channel interference.

9. A Maximum Likelihood Receiver according to claim 8, wherein C is the estimated envelope of the signal having the co-channel interference.

10. A Maximum Likelihood Receiver according to claim 8, wherein β has a value which is 0<β≦1.

11. A method for decoding a signal in the presence of an additive channel interference and a co-channel interference, comprising:

a) receiving the signal comprising the interference;

b) digitally modulating the received signal to obtain a modulated signal;

c) determining a hypothesized received signal by excluding the additive channel interference from the received signal; and d) determining a maximum likely sequence by applying the modulated signal and using the following decision metric:

$$\sum_n (|y_n - d_n| - \beta C)^2,$$

wherein:

$y_n$ is the received signal;

$d_n$ is the hypothesized received signal excluding the additive channel interference;

β is an empirical coefficient, wherein β>0; and

C is the envelope of a signal having the co-channel interference.

12. A Maximum Likelihood Receiver, comprising:

an arrangement receiving a signal and applying a decision metric to the received signal in the presence of an additive channel interference and a co-channel interference, wherein the decision metric is as follows:

$$\sum_n (|y_n - d_n| - \beta C)^2, \text{ and}$$

wherein:

$y_n$ is the received signal;

$d_n$ is the hypothesized received signal excluding the additive channel interference;

β is an empirical coefficient, wherein β>0; and

C is the envelope of a signal having the co-channel interference.

* * * * *